(12) United States Patent
Lauffer et al.

(10) Patent No.: US 7,209,368 B2
(45) Date of Patent: Apr. 24, 2007

(54) CIRCUITIZED SUBSTRATE WITH SIGNAL WIRE SHIELDING, ELECTRICAL ASSEMBLY UTILIZING SAME AND METHOD OF MAKING

(75) Inventors: John M. Lauffer, Waverly, NY (US); Voya Markovich, Endwell, NY (US); Corey Seastrand, Apalachin, NY (US); David L. Thomas, Endicott, NY (US)

(73) Assignee: Endicott Interconnect Technologies, Inc., Endicott, NY (US)

(*) Notice: Subject to any disclaimer, the term of this patent is extended or adjusted under 35 U.S.C. 154(b) by 313 days.

(21) Appl. No.: 10/790,747

(22) Filed: Mar. 3, 2004

(65) Prior Publication Data

US 2005/0195585 A1 Sep. 8, 2005

Related U.S. Application Data

(63) Continuation-in-part of application No. 10/354,000, filed on Jan. 30, 2003, now Pat. No. 6,828,514.

(51) Int. Cl.
*H05K 9/00* (2006.01)

(52) U.S. Cl. .................. 361/816; 361/794; 361/818; 361/767; 361/777; 361/778; 361/795; 174/252

(58) Field of Classification Search ............... 361/748, 361/751, 767, 777–778, 794, 795, 808, 816, 361/818; 174/260–262, 264, 255, 258
See application file for complete search history.

(56) References Cited

U.S. PATENT DOCUMENTS

| | | | |
|---|---|---|---|
| 5,031,073 A | 7/1991 | Chang | |
| 5,196,230 A | 3/1993 | Okonogi et al. | |
| 5,455,393 A * | 10/1995 | Ohshima et al. | ............ 174/250 |
| 5,649,160 A | 7/1997 | Corry et al. | |
| 5,662,816 A * | 9/1997 | Andry | ......................... 216/18 |
| 5,684,340 A | 11/1997 | Soler et al. | |
| 6,010,769 A * | 1/2000 | Sasaoka et al. | ............ 428/209 |
| 6,020,614 A | 2/2000 | Worley | |
| 6,040,524 A * | 3/2000 | Kobayashi et al. | ........... 174/36 |
| 6,236,572 B1 * | 5/2001 | Teshome et al. | ............ 361/794 |
| 6,239,485 B1 * | 5/2001 | Peters et al. | ................. 257/700 |
| 6,353,189 B1 * | 3/2002 | Shimada et al. | ............ 174/255 |
| 6,429,752 B1 | 8/2002 | Harju et al. | |
| 6,429,757 B1 | 8/2002 | Karlsson et al. | |
| 6,522,214 B1 | 2/2003 | Harju et al. | |
| 6,529,229 B2 | 3/2003 | Nagumo | |
| 6,657,130 B2 * | 12/2003 | Van Dyke et al. | .......... 174/255 |
| 6,992,255 B2 * | 1/2006 | Oprysko et al. | ............ 174/262 |
| 2002/0100613 A1 | 8/2002 | Anstrom et al. | |
| 2002/0108780 A1 | 8/2002 | Blackwell et al. | |
| 2002/0148637 A1 | 10/2002 | Anstrom et al. | |
| 2004/0009666 A1 * | 1/2004 | Ishizuki et al. | ............ 438/689 |

* cited by examiner

*Primary Examiner*—Dean A. Reichard
*Assistant Examiner*—Hoa C. Nguyen
(74) *Attorney, Agent, or Firm*—Hinman, Howard & Kattell, LLP; Lawrence R. Fraley

(57) ABSTRACT

A circuitized substrate in which at least one signal line used therein is shielded by a pair of opposingly positioned ground lines which in turn are electrically coupled to a ground plane located beneath the signal and ground lines and separated therefrom by a common interim dielectric layer. An electrical assembly including the circuitized substrate as part thereof and a method of making the circuitized substrate are also included. The substrate may form part of a larger structure such as a PCB, chip carrier or the like.

17 Claims, 3 Drawing Sheets

CIRCUITIZED SUBSTRATE WITH SIGNAL WIRE SHIELDING, ELECTRICAL ASSEMBLY UTILIZING SAME AND METHOD OF MAKING

CROSS REFERENCE TO CO-PENDING APPLICATION

This application is a continuation-in-part application of Ser. No. 10/354,000, filed Jan. 30, 2003, and now U.S. Pat. No. 6,828,514.

TECHNICAL FIELD

The invention relates to circuitized substrates and particularly to such substrates which might be utilized as part of a larger circuitized substrate such as a printed circuit (or wiring) board, semiconductor chip carrier, or the like, and particularly to such substrates (and larger products) which are adapted for processing high speed signals across various planes thereof. More particularly, the invention relates to such substrates and larger products designed to shield signal lines therein and/or thereon.

BACKGROUND OF THE INVENTION

The need for higher speed circuitries in circuitized substrates such as those used in multilayered printed circuit boards (PCBs), chip carriers, etc. have arisen due to technological advances, in turn giving rise to the need for higher speed digital signal transmissions. If not properly implemented, the reduction in the rise and fall time of high-frequency digital signals propagating within the final product, e.g., a PCB, may lead to a compromise in signal integrity, for example cross-talk noise and signal distortions due to impedance mismatch.

A signal path on a PCB or chip carrier at relatively low frequencies may be represented electrically as a lumped network of series resistances and shunt capacitances. However, as the frequency is increased, this approach of lumped circuit modeling breaks down, and signal paths must be regarded as transmission lines. The common transmission line structures used, for example, in PCBs, are microstrip, embedded microstrip, stripline and dual striplines. The microstrip configuration simply refers to the case where the conductor is separated from a reference plane, either ground or power, by a dielectric. The stripline configuration, on the other hand, has reference planes above and below the conductor. A typical multilayer PCB of more than two signal layers may have both stripline and microstrip geometries.

The present invention as defined herein is directed at reducing and substantially eliminating cross-talk noise between signal lines located on conductive layers in a circuitized substrate such as one used in a multilayered PCB or chip carrier by providing effective shielding of the signal line(s) in the substrate (and therefore in the PCB or carrier if utilized therein). Crosstalk, as is known, is a category of noise induced primarily by the electromagnetic coupling between signal lines. In multilayered PCBs, especially those of relatively complex construction, crosstalk can occur by the electrical coupling between relatively closely spaced signal traces (lines). Crosstalk decreases noise margins and degrades signal quality. This, of course, can be a major limiting factor in communication systems performance. Crosstalk increases with longer trace coupling distances, smaller separation between traces, shorter pulse rise and fall times, larger magnitude currents or voltages being switched.

Inductive and capacitive coupling are the two known types of signal coupling that are the crosstalk determinant in a multilayered PCB circuit plane. These two types of coupling decrease with increasing distance between source and receiver. Most crosstalk can be attributed to adjacent wires. Because parallel and adjacent wires on a PCB conductive layer interact both capacitively and inductively, the distance over which adjacent wires are parallel needs to be carefully controlled. To minimize crosstalk, some high frequency designs incorporate ground planes under each signal layer, which have proven to virtually eliminate the crosstalk between these layers. Ideally, then, crosstalk between neighboring signals can be reduced by maximizing signal-to-signal spacing and by minimizing signal-to-ground distances. These factors, plus a host of others, contain many interdependencies and are often at odds with one another. For example, high wiring density is required to minimize interconnect delays as well as size, cost and weight. However, as signal lines are placed closer together, their mutual coupling increases, with a corresponding rise in crosstalk levels.

The design of PCBs, chip carriers and similar structures which include circuitized substructures (e.g., those often referred to as "cores") as part thereof, therefore, has become quite a challenging task, especially when designing high-performance and high-density final products. Most significantly, electromagnetic coupling between the adjacent signal lines (aka traces) is one factor that sets the upper limit to the interconnect density.

In one known multilayered PCB structure, the structure includes a first layer having an electrically conductive plane for electrical connection to a common armature contact of a relay, the electrically conductive plane being sized to substantially cover a mounting footprint of the relay. This PCB structure also includes a second layer parallel to and electrically separate from the first layer, the second layer having an electrically conducting first section for electrical connection to a normally-open contact of the relay and an electrically conducting second section for electrical connection to a normally-closed contact of the relay. The first and said second sections are electrically separate from each other and, in combination with each other, are planar and sized to substantially cover the mounting footprint of the relay.

In U.S. Pat. No. 6,529,229, first and second clock signal lines are preferably mutually adjacent, and preferably weave around electrode pads and/or wiring patterns used to interconnect the driver ICs. The preferred even-odd variation of the interconnections between the driver integrated circuits (ICs) and the clock signal lines facilitates the mutually adjacent weaving layout of the clock signal lines, which improves their noise immunity. The clock signal lines preferably include in-line electrode pads to which the clock input terminals of the driver ICs are coupled. The in-line electrode pads reduce reflection of the clock signals because they avoid characteristic-impedance discontinuities.

Coupling semiconductor devices (integrated circuits or chips), including those of the multi-mode variety (analog and digital) onto PCBs, has resulted in various attempts to reduce noise generation and the associated problems. One attempt to solve the noise problem involves the addition of decoupling capacitors placed near the active devices. The decoupling capacitors stabilize the current flowing to these devices. However, while the capacitor absorbs some of the voltage, an undesirable spike still occurs.

Another known attempt to manage switching noise in multi- or mixed-mode structures involve partitioning analog and digital functions. This process requires unique manufacturing processes and custom designs. For example, U.S. Pat. No. 6,020,614 suggests that noise can be reduced by establishing boundary zones between the analog and digital circuits of a semiconductor substrate with the analog circuit having a separate power supply bus from the digital circuit. Further, this patent mentions providing interconnect signal lines such that the isolated wires between the circuits may functionally interact with other circuits while the substrate noise coupling from other circuits remains low. However, spacing the analog components from the digital components can waste precious semiconductor space, which is an important consideration in integrated circuit (and PCB) design.

Another attempt to resolve switching noise problems in a multi-mode structure is addressed in U.S. Pat. No. 5,649,160. This patent suggests that the noise can be reduced by shaping the noise from the digital circuit and concentrating it in a single or a small number of parts of the frequency spectrum. This solution relies on the concept that the presence of noise in the analog circuit is less important at certain frequencies, and therefore the spectral peak or peaks from the digital circuit can be carefully placed to result in little or no interference.

Other approaches for arranging transmission lines on microwave circuit structures are described in U.S. Pat. Nos. 6,429,752, 6,429,757 and 6,522,214. And, in U.S. Pat. No. 5,031,073, there is described a PCB in which the board's circuitry is partitioned into a plurality of circuit regions which are selectively isolated with respect to input and output signals. Signal lines in one region are arranged in a closely spaced array aligned with, but spaced from, a corresponding array in an adjacent region. Other shielding structures are described in U.S. Pat. Nos. 5,196,230, 5,684,340 and 6,040,524.

Additional examples of various PCB multilayered structures are shown and described in more recent documents, these being U.S. Published patent applications US2002/0108780 A1, US 2002/0148637 A1, US 2002/0100613 A1 and US2004/0009666 A1, the teachings of which are incorporated herein by reference, as are the teachings of the other documents cited in this Background.

As defined hereinbelow, the present invention defines a new and unique circuitized substrate in which cross-talk is substantially eliminated between adjacent signal lines or between signal lines and adjacent lines designed to conduct power signals on a singular plane within the substrate. Such a substrate design, as taught herein, is of simpler construction and operates more expeditiously than many of those described above, is relatively less expensive to manufacture than same, and thus represents a significant advancement in the art. Of equal significance, the substrate defined herein is readily adaptable for utilization within larger circuitized structures such as multilayered, complex PCBs, chip carriers and the like.

DISCLOSURE OF THE INVENTION

It is a primary object of the present invention to enhance the circuitized substrate art.

It is another object of the invention to provide a circuitized substrate which is capable of operating effectively with a minimum of crosstalk while still allowing high density wiring patterns, if desired, e.g., to couple electronic packages such as chip carriers thereto if incorporated within a larger structure such as the aforementioned PCBs, chip carriers, etc.

It is another object of the invention to provide a circuitized substrate which can be manufactured and incorporated within larger structures using present technology and at less costs compared to present methods used to manufacture such structures.

According to one aspect of the invention, there is provided a substrate comprising at least one dielectric layer having first and second opposing sides, a conductive ground plane located on said first opposing side of said dielectric layer, at least one conductive signal line located on said second opposing side of said dielectric layer, and first and second conductive ground lines located on the second opposing side of the dielectric layer on opposite sides of the at least one conductive signal line and electrically coupled to said ground plane located on said first opposing side of the dielectric layer. The first and second conductive ground lines provide shielding for the at least one conductive signal line during the passage of electrical current through the signal line.

According to another aspect of the invention, there is provided an electrical assembly comprising an electrical component and a circuitized substrate including at least one dielectric layer having first and second opposing sides, a conductive ground plane located on the first opposing side of the conductive ground plane, at least one conductive signal line located on the second opposing side of the dielectric layer, and first and second conductive ground lines located on the second opposing side of the dielectric layer on opposite sides of the at least one conductive signal line and electrically coupled to said ground plane located on said first opposing side of said dielectric layer. The first and second conductive ground lines provide shielding for the at least one conductive signal line during the passage of electrical current through the signal line. The electrical component is electrically coupled to the circuitized substrate.

According to yet another aspect of the invention, there is provided a method of making a circuitized substrate, the method comprising providing at least one dielectric layer having first and second opposing sides, positioning a conductive ground plane on the first opposing side of the conductive ground plane, positioning at least one conductive signal line on the second opposing side of said dielectric layer, and positioning first and second conductive ground lines on the second opposing side of the dielectric layer on opposite sides of the at least one conductive signal line. The method further comprises the step of electrically coupling the first and second conductive ground lines to the conductive ground plane located on the first opposing side of the dielectric layer such that the first and second conductive ground lines will provide shielding for the at least one conductive signal line during the passage of electrical current through said signal line.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals will be used to indicate like elements from FIG. to FIG.

Figure 1:
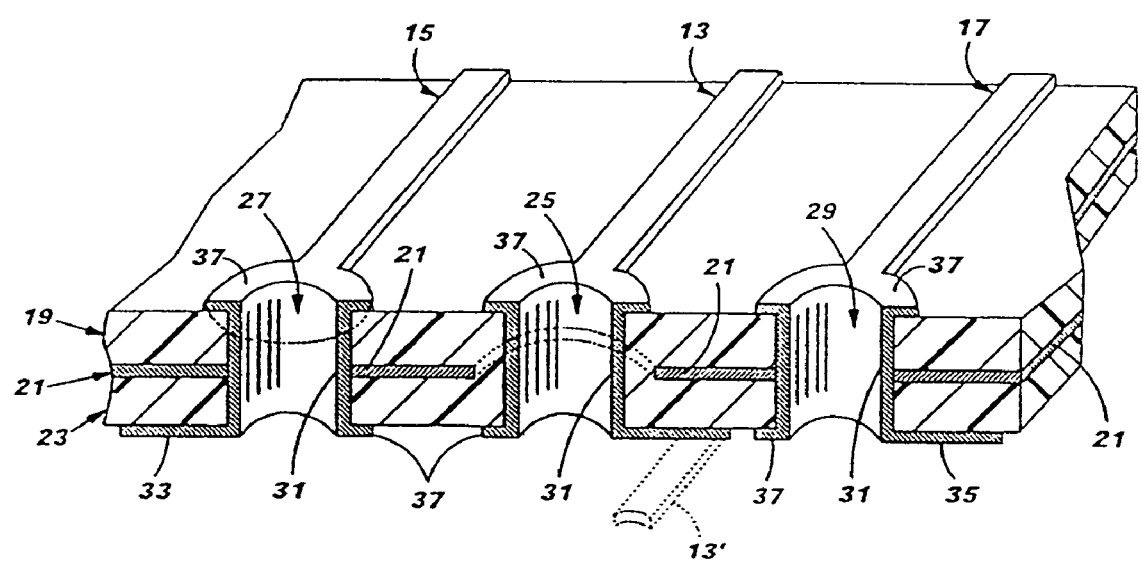
FIG. 1 is a partial, sectional perspective view of a circuitized substrate according to one embodiment of the invention, showing the positioning relationship of the opposed conductive ground lines and the internal conductive signal relative to the conductive ground plane, according to one aspect of the invention.

In FIG. 1, there is shown a circuitized substrate 10 according to one aspect of the invention. As will be understood from the following description, the resulting structure, in the broadest aspects thereof and as defined herein, is a circuitized substrate which includes at least one electrically conductive signal line 13 which receives electrical shielding protection from two adjacent and opposed electrically conductive ground lines 15 and 17, located on the same surface of the board and thus in a planar relationship. As to be understood from the teachings herein, the circuitized substrate of the invention is readily adaptable for use within (to thus form part of) a larger structure such as a multilayered PCB, chip carrier, or the like. Although only one signal line is shown, it is understood that several signal lines may be utilized, especially if the substrate is so utilized within a PCB, chip carrier or the like, so the teachings of this invention are also applicable to utilization of such added lines and the protection thereof. In one example wherein the circuitized substrate as taught herein is utilized in a multilayered, relatively complex PCB, several thousand signal lines may be utilized in combination with a similar number of paired opposing conductive ground lines adjacent thereto. The invention is thus not limited to a singular-signal and one pair of ground lines configuration.

Figure 2:
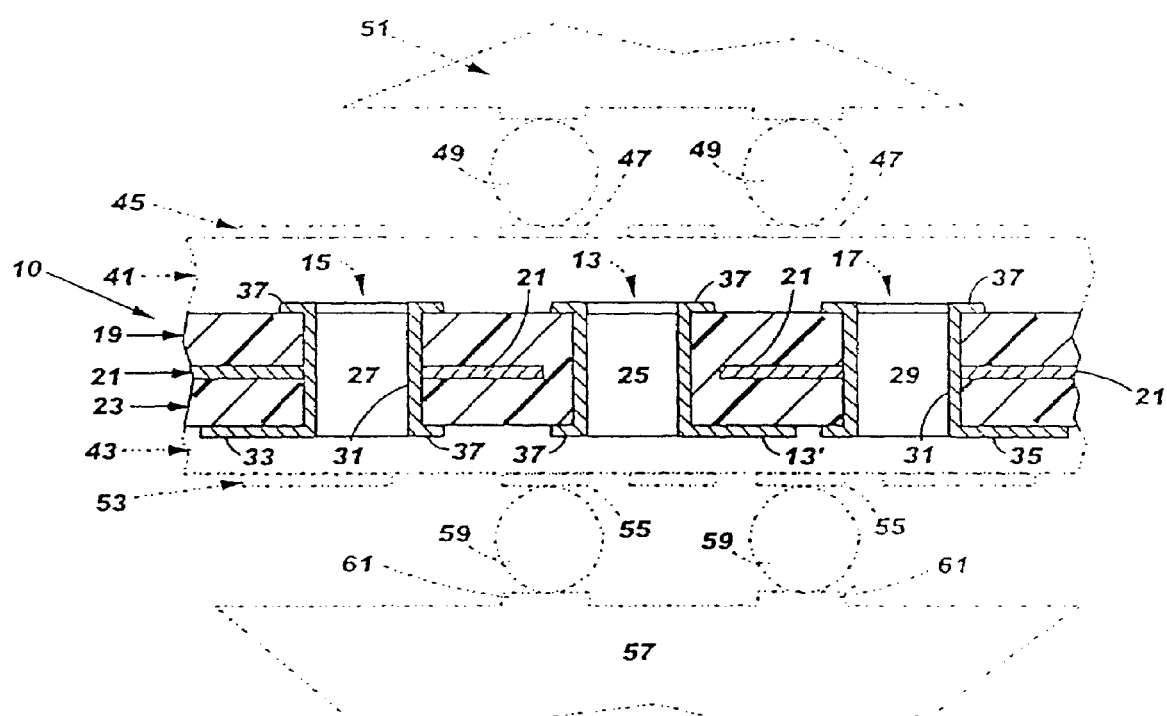
FIG. 2 is an elevational view, in section, of the substrate of FIG. 1, showing the addition of other layers, and at least one component (two are shown) for use therewith, so as to form an electrical assembly according to one aspect of the invention.

The structure as shown in FIG. 1 may also form what may be referred to as a two signal and one power (2S1P) core structure, several of which are presently made by the Assignee of the present invention and which are then utilized as part of multilayered PCBs of complex construction, also produced and sold by the present Assignee. If so utilized, one example of additional signal, ground and/or power layers which may be added to form this larger PCB structure are shown in FIG. 2, described herein below.

The structure shown in FIG. 1 comprises at least one dielectric layer 19 on one surface of which are located the co-planar lines 13, 15 and 17. On-the opposing surface is located a conductive ground plane 21 which, as shown, is substantially solid in configuration and extends across the lower surface substantially beneath the parallel lines 13, 15 and 17 running thereabove. Lines 13, 15 and 17, and ground plane 21 are each preferably comprised of copper, and formed using conventional PCB manufacturing processing, e.g., layer lamination of the solid sheet copper foil for the ground plane and photolithographic processing for the individual conductive lines. Further description is thus not believed necessary. In one example, the lines are from about 0.0005 to about 0.002 inch thick, and are spaced apart a total distance of only about 0.002 to 0.010 inch from one another. The interim dielectric layer (as well as other dielectric layers if used with the invention) is preferably comprised of conventional material (e.g., fiberglass-reinforced polymer resin, also known as "FR4" in the industry. Other dielectric materials may include Teflon (a trademark of E.I. DuPont deNemours and Company) and Driclad (a trademark of the Assignee of the invention). In one example, layer 19 may possess a thickness following lamination of about 0.0015 to 0.015 inch. Once the opposed lines and ground plane are formed on the opposite sides of the interim dielectric layer, this "subcomposite" is then bonded to a second dielectric layer 23 and a second conductive layer (of signal and/or ground lines) is formed, again using conventional techniques as described above. The bonding of the second dielectric layer 23 is preferably accomplished using conventional lamination processes which utilize heat and pressure as part thereof. In one example of the invention, temperatures from about 175 degrees Celsius to about 250 degrees Celsius and pressures from about 100 pounds per square inch to about 1,100 pounds per square inch are possible. Similarly, if additional signal, ground and/or power layers are desired (the preferred embodiment), these may be simply arranged in a stacked orientation and simultaneously laminated with the layers in FIG. 1. Further description is not considered necessary.

In FIG. 1, at least three conductive thru-holes 25, 27 and 29 are formed to provide electrical connections to additional circuitry, or, in the case of ground lines 15 and 17, to the planar conductive ground plane 21. The formation of such thru-holes is first accomplished by providing openings within the structure, such as by using mechanical or laser drilling, the later preferred for the instant invention. In one example, each thru-hole may possess an internal diameter of only about 0.003 inch, following which a layer of copper 31, having a thickness of only about 0.0005 inch, is plated thereon to provide the conductive medium. Significantly, the internally positioned signal line 13 does not couple to the ground plane but instead preferably is coupled using thru-hole 25 to another signal line 13' (shown in phantom) on the underside of layer 23. Similarly, the outer ground lines 15 and 17 may be coupled to yet another ground line or plane such as represented by the numerals 33 and 35, respectively. Such couplings using thru-holes is facilitated by the formation of conductive lands 37 on the illustrated dielectric surfaces, such land formation known in the art and further description is not deemed necessary. Each land will in turn be comprised of copper and of the same thickness as the connecting line coupled thereto.

The structure shown in FIG. 1 in its simplest form may comprise the singular dielectric layer 19 and opposing conductive lines 13, 15 and 17, and plane 21. In the preferred embodiment, of course, more layers are needed to satisfy the more stringent functional capabilities demanded of many of today's more complex PCB and other conductive structures in which the invention will be utilized. By way of example, in FIG. 2, circuitized substrate 10 further includes third and fourth dielectric layers 41 and 43 (in phantom) bonded on opposite sides of the substrate, each of these dielectric layers including a conductive layer thereon (also in phantom). The first of these layers, represented by the numeral 45, includes a plurality of conductive pads 47, each of which is designed for having an external conductor such as 49 secured thereto. In one example, pads 47 are comprised of copper and the external conductors 49 are preferably solder balls, e.g., those containing 63:37 tin:lead "eutectic" solder alloy. Alternatively, the solder balls may be comprised of another solder such as 90:10 tin:lead alloy. A total of about 3600 pads (and solder balls) may be used in one example of the invention (another example of the high density construction the invention is able to attain), and serve to electrically couple the resulting structure shown in FIG. 2 (now what can be referred to as a PCB or chip carrier or the like) to an external electrical component 51, a preferred example being a chip carrier known as a HyperBGA chip carrier also produced and sold by the Assignee of the invention. HyperBGA is a trademark of the Assignee, Endicott Interconnect Technologies, Inc. If component 51 is a chip carrier, then the multilayered structure including substrate 10 is preferably a PCB. In another example, component 51 may comprise a semiconductor chip which is designed for being directly coupled (surface mounted) onto the upper pads on the FIG. 2 structure. If a chip is being coupled, the FIG. 2 structure is preferably a chip carrier, and, if so, smaller solder balls are preferably used for this coupling purpose compared to those use to couple a traditionally larger chip carrier coupled to a PCB. In addition to pads 47, the conductive layer 45 may also include additional signal lines or the like thereon, e.g., coupling selected ones of the pads if mandated by the electrical circuitry design of the final product using the invention.

In FIG. 2, there is also shown yet another conductive layer 53 on the underside of the FIG. 2 structure (and also shown in phantom). Layer 53 may comprise a plurality of conductor pads 55 (and other conductive circuitry as shown) for coupling the structure to another electrical component, in this case, preferably a PCB 57 (in phantom). In this manner, the structure shown is preferably a chip carrier, and solder balls 59, preferably of one of the above compositions for solder balls 49, are utilized to complete the connections. In one example, a total of the aforementioned approximately 3600. pads (and solder balls) are used for this connection to the above structure. Pads 61 are used to connect the solder balls to the corresponding pads 55. Pads 55 and 61 are also preferably of copper, as are any other conductive lines or pads on the layer 53 or on the upper surface of structure 57. This structure, as mentioned above, may also include additional internal conductive planes and/or lines (not shown) to provide greater functional capability for the final structure. This structure is thus an electrical assembly including the circuitized substrate defined above (with-additional layers to form a chip carrier) and chip 51 and. PCB 57.

Such a chip carrier (or electronic package, as these are also referred to in the industry), or a semiconductor chip if utilized instead, would be positioned in the approximate location illustrated in a substantially rectangular pattern of pads and corresponding solder balls. A similar, perhaps larger rectangular pattern is used on the PCB 57, as indicated in FIG. 2 by the relative differences in size. This is not limitative of the invention however, as other patterns and sizes are possible.

In a particularly preferred embodiment of the invention as produced by the Assignee of the invention, the circuitized substrate 10 of FIG. 1 forms what is referred to as a "core" structure, which is then combined with other similar core structures (and other layers such as interim dielectric material sheets positioned therebetween prior to final bonding) to form a multilayered PCB. In one example, five such "cores" are stacked atop one another, along with intermediate (interim) dielectric and conductive ground planes, to form a much larger PCB assembly. In one preferred example of such a final PCB structure, the stacked (and laminated) final structure is comprised of a first opposing (top) external conductive layer, dielectric layer, conductive ground plane, dielectric layer, a circuitized substrate "core" 10, dielectric layer, conductive ground plane, dielectric layer, a second circuitized substrate "core" 10, and continuing in a similar sequential order to a fifth circuitized substrate "core" 10, followed by a dielectric layer, conductive ground plane, dielectric layer and, finally, a second opposing (bottom) external conductive layer. The top and bottom external conductive layers, conductive ground planes and the five "cores" 10 are electrically interconnected, where desired, using conventionally drilled and plated through hole technology known in the PCB art. Thus, in this particularly preferred embodiment of the invention, very high density, shielded wiring can be achieved due to the multiple core layers and small geometry of the shielding structures that are possible on the initial core structures utilized in the final product. This final product is then capable of being successfully utilized in an electrical assembly such as a personal computer, mainframe, server, or the like, what may also be referred to generally as an "information handling system." As such, the structure will of course include additional components such as chips, resistors, capacitor, etc. as part thereof and will be electrically coupled into the ultimate assembly's circuitry.

Figure 3:
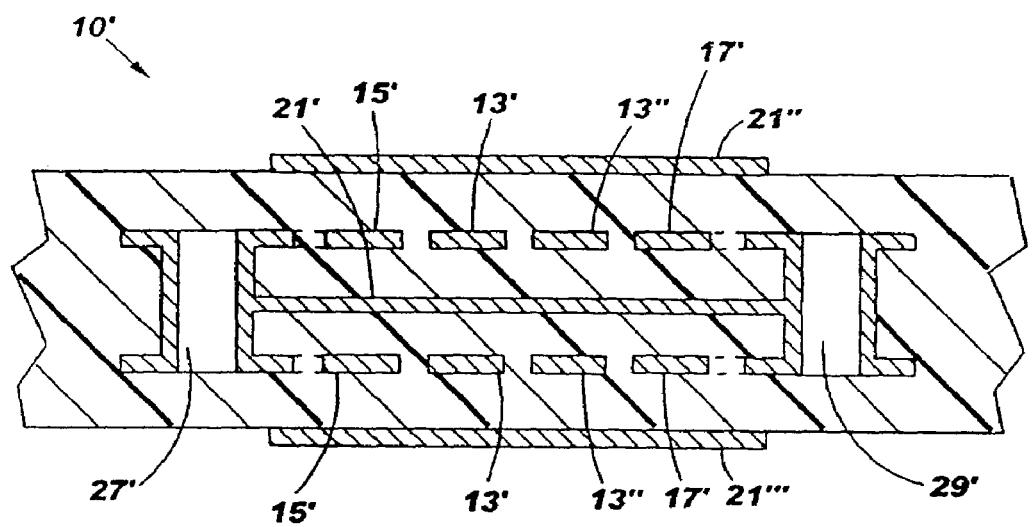
FIG. 3 is an elevational view, in section and on a larger scale over the views of FIGS. 1 and 2, showing a circuitized substrate according to another embodiment of the invention.

The embodiment of FIG. 1, in its simplest construction, thus represents a shielding structure for single-ended controlled impedance conductive lines (e.g. signal lines 13 between ground lines 15 and 17). A similar configuration can be achieved for differentially controlled lines by placing the differential paired signal lines 13' and 13" between the ground lines 15' and 17' (e.g. ground-signal-signal-ground) as shown in FIG. 3, the circuitized substrate 10' of FIG. 3 thus described as an embedded differential pair coplanar circuitized substrate. Three ground planes 21', 21" and 21'", of substantially solid and planar construction, are positioned as shown in FIG. 3, as are adjacent conductive thru-holes 27' and 29' (which are electrically coupled to interim ground plane 21' as these were in FIG. 1. Thus, each pair of adjacent and coplanar signal lines 13' and 13" form a differential pair with reference (ground) planes 21' and 21" and the upper coplanar adjacent ground lines 15' and 17' providing the shielding for the upper pair 13' and 13", while ground planes 21' and 21'" and the lower adjacent and coplanar ground lines 15' and 17' form shielding for the lower pair of signal lines 13' and 13".

Figure 4:
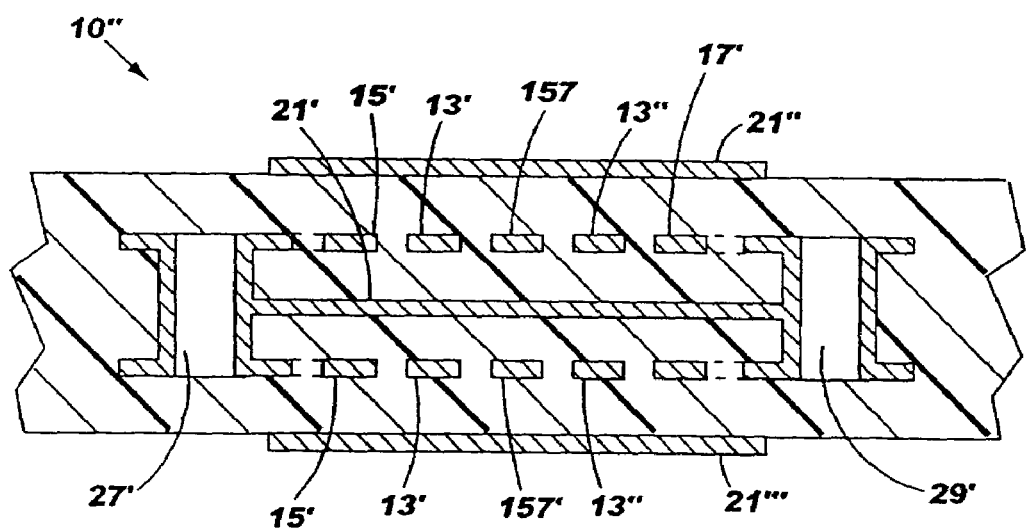
FIG. 4 is an elevational view, in section and on a larger scale over the views of FIGS. 1 and 2, showing a circuitized structure according to yet another embodiment of the invention.

The embodiment of FIG. 4, circuitized substrate 10", is similar in construction to that of FIG. 3 except for the addition of shielding ground lines 157 and 157' on the same plane and between each respective upper and lower pair of signal lines 13' and 13". As understood, all ground planes and ground lines shown in the drawings are electrically coupled (to ground). In FIG. 4, one ground line is positioned between each signal line, on both the upper and lower planes along which the signal lines are located. Thus, in FIG. 4, signal lines 13' and 13" on one plane (i.e., the upper) are referenced to ground planes on opposite sides of this pair of lines (as in FIG. 3), while those of the other signal lines are referenced to the ground planes opposite said pair. A key feature of this construction of this embodiment of the invention is that the signal line to signal line pitch (spacing) is approximately one half that of unshielded signal lines having the same impedance and dielectric thickness. Thus, a 2× improvement in wiring density can be achieved, allowing for a much higher density printed circuit board in the same overall thickness. The structures depicted in FIGS. 3 and 4, if incorporated within larger multilayered structures such as multilayered PCBs, can also be referred to as an embedded differential pair coplanar waveguide (FIG. 3) or a single-ended coplanar waveguide (FIG. 4) embedded within said multilayered structure, if this is the purpose of such a PCB (to serve as a waveguide component).

There has thus been shown and described a circuitized substrate construction which significantly reduces cross-talk noise for a conductive signal line (or pair of lines) in which a separate conductive ground plane (or more, as defined) is used in combination with two adjacent ground lines on the same plane as the signal line to provide shielding for the signal line, the ground plane located on a separate plane beneath all three lines and parallel thereto. The resulting structure substantially reduces cross-talk noise between adjacent signal lines and planes to result in a final structure capable of operating at both high and low frequencies, the former especially desirable in today's more complex board technologies. The signal patterns and resulting connecting structures as described herein are possible on a high density basis wherein the adjacent signal lines on one plane may be as closely spaced as only about 0.006 inch apart on the same plane. This represents a significant advancement in the art, particularly considering that the structure as produced herein may be manufactured using conventional PCB technologies, thus representing a substantially reduced cost product to the end purchaser.

While there have been shown and described what are at present the preferred embodiments of the invention, it will be obvious to those skilled in the art that various changes and modifications may be made therein without departing from the scope of the invention as defined by the appended claims.

What is claimed is:

1. A circuitized substrate comprising:
   first and second dielectric layers, each of said first and second dielectric layers having first and second opposing sides;
   a substantially solid conductive ground plane located between said first opposing side of said first dielectric layer and said first opposing side of said second dielectric layer;
   a first conductive signal line located on said second opposing side of said first dielectric layer and a second conductive line located on said second opposing side of said second dielectric layer;
   first and second conductive ground lines located on said second opposing side of said first dielectric layer on opposite sides of said first conductive signal line and electrically coupled to said substantially solid conductive ground plane located on said first opposing side of said dielectric layer; and
   a first conductive thru-hole extending through said substantially solid conductive ground plane and electrically coupling said first conductive signal line to said second conductive signal line, said first and second conductive ground lines and said substantially conductive ground plane providing shielding for said at least one conductive signal line during the passage of electrical current through said signal line.

2. The circuitized substrate of claim 1 wherein said first and second dielectric layers are each selected from the group consisting of fiberglass-reinforced polymer resin, Teflon and Driclad and combinations thereof.

3. The circuitized substrate of claim 1 wherein said substantially solid conductive ground plane is comprised of copper.

4. The circuitized substrate of claim 1 wherein each of said first and second conductive signal lines is comprised of copper.

5. The circuitized substrate of claim 1 wherein said first and second conductive ground lines are each comprised of copper.

6. The circuitized substrate of claim 1 further including second and third conductive thru-holes, said second and third conductive thru-holes electrically coupling said first and second conductive ground lines to said substantially solid conductive ground plane, respectively.

7. The circuitized substrate of claim 1 further including additional dielectric and conductive layers as part thereof.

8. The circuitized substrate of claim 7 further including first and second pluralities of external conductive pads located on opposite sides of said circuitized substrate for electrically coupling said circuitized substrate to external electrical components.

9. The invention of claim 8 wherein said circuitized substrate is a chip carrier.

10. The invention of claim 8 wherein said circuitized substrate is a printed circuit board.

11. The circuitized substrate of claim 1 further including a third conductive signal line positioned on said second opposing side of said first dielectric layer adjacent said first conductive signal line, said first and second conductive ground lines and said substantially solid conductive ground plane also providing shielding for said third conductive signal line during the passage of electrical current through said third conductive signal line.

12. The circuitized substrate of claim 11 further including a conductive ground line positioned on said second opposing side of said first dielectric layer substantially between said first and third conductive signal lines, said conductive ground line also providing shielding for said first and third conductive signal lines during the passage of electrical current through said first and third conductive signal lines.

13. The circuitized substrate of claim 1 further including third and fourth dielectric layers positioned on said first and second dielectric layers, respectively, and second and third substantially solid conductive ground planes positioned on said third and fourth dielectric layers, respectively, said second and third substantially solid conductive ground planes also providing shielding for said at least one conductive signal line during the passage of electrical current through said signal line.

14. An electrical assembly comprising:
   an electrical component; and
   a printed circuit board including a circuitized substrate having first and second dielectric layers, each of said first and second dielectric layers having first and second opposing sides, a substantially solid conductive ground plane located between said first opposing side of said first dielectric layer and said first opposing side of said second dielectric layer, a first conductive signal line located on said second opposing side of said first dielectric layer and a second conductive line located on said second opposing side of said second dielectric layer; first and second conductive ground lines located on said second opposing side of said first dielectric layer on opposite sides of said first conductive signal line and electrically coupled to said substantially solid conductive ground plane located on said first opposing side of said dielectric layer, and a first conductive thru-hole extending through said substantially solid conductive ground plane and electrically coupling said first conductive signal line to said second conductive signal line, said first and second conductive ground lines and said substantially conductive ground plane providing shielding for said at least one conductive signal line during the passage of electrical current through said signal line, said electrical component being electrically coupled to said printed circuit board.

15. The electrical assembly of claim 14 wherein said electrical component is a chip carrier.

16. The electrical assembly of claim 14 wherein said electrical component is a semiconductor chip.

17. The electrical assembly of claim 14 wherein said circuitized substrate further includes second and third conductive thru-holes, said second and third conductive thru-holes electrically coupling said first and second conductive ground lines to said substantially solid conductive ground plane.

* * * * *